(12) United States Patent
Mak et al.

(10) Patent No.: US 7,659,780 B2
(45) Date of Patent: Feb. 9, 2010

(54) GAIN CONTROL CIRCUIT

(75) Inventors: Chit Ah Mak, Fremont, CA (US); Chun Fai Wong, Hong Kong (HK); Lap Chi Leung, Hong Kong (HK); Xiaofei Kuang, Hong Kong (HK); Jennifer Shuet Yan Ho, Hong Kong (HK); David Kwok Kuen Kwong, Davis, CA (US)

(73) Assignee: Hong Kong Applied Science and Technology Research Institute Co., Ltd., Hong Kong (CN)

( * ) Notice: Subject to any disclaimer, the term of this patent is extended or adjusted under 35 U.S.C. 154(b) by 26 days.

(21) Appl. No.: 11/947,085

(22) Filed: Nov. 29, 2007

(65) Prior Publication Data

US 2009/0140808 A1    Jun. 4, 2009

(51) Int. Cl.
    *H03F 3/45* (2006.01)
(52) U.S. Cl. ......................................... 330/260; 330/98
(58) Field of Classification Search ................. 330/260, 330/69, 310, 150, 98
    See application file for complete search history.

(56) References Cited

U.S. PATENT DOCUMENTS

| 4,366,446 | A | * | 12/1982 | Henderson et al. .......... 330/260 |
| 4,546,327 | A | * | 10/1985 | Suzuki et al. ............... 330/253 |
| 4,931,797 | A | * | 6/1990 | Kagawa et al. .............. 341/162 |
| 4,933,647 | A | | 6/1990 | Dea |
| 5,424,682 | A | * | 6/1995 | Gomez et al. ............... 330/254 |

* cited by examiner

*Primary Examiner*—Henry K Choe
(74) *Attorney, Agent, or Firm*—Ryan A. Schneider; Troutman Sanders LLP

(57) ABSTRACT

A gain control circuit including a resistor with a first terminal and a second terminal; an operational amplifier with an inverting terminal thereof electrically coupled to said first terminal of said resistor; a non-inverting terminal thereof; and an output terminal thereof; an amplifier circuit for transforming the voltage change of said operational amplifier output into a substantially exponential current change; wherein the output of said amplifier circuit is electrically coupled to said inverting terminal of said operational amplifier. The above described gain control circuit is able to perform wide bandwidth input signal buffering with linearity under low voltage and low power conditions. The circuit also offers low output impedances without the need of additional buffers and hence minimizing circuit size and manufacturing costs.

9 Claims, 6 Drawing Sheets

GAIN CONTROL CIRCUIT

BACKGROUND OF THE INVENTION

1. Field of the Invention

The present invention relates generally to analogue circuits and in particular to gain control circuits.

2. Description of Related Art

In many electronics systems where weak signals generated by sensors or transducers are captured, amplification is required at the front end of the systems to increase the signal strength for further processing of the information carried by such signals. For example, known voltage multipliers make use of voltage buffers to convert the input signal voltage to corresponding signal voltage. In some occasions, the signal conversion is preferably accompanied with gain adjustment for different signal strengths. The gain for weak signals are arranged to be higher than the gain for strong signals. Through such distortion, a high resolution of weak signals can be achieved while keeping strong signal within the dynamic range. The foregoing gain adjustment can be performed in an automatic manner by utilizing devices that can offer controlled impedances, for example, diodes through current drive. However, additional buffer circuitry is needed to enhance the output drive of the pre-amplification stage.

Front-end amplifiers with current feedback configuration are also used for pre-amplification to convert signals from voltage to current representation. Nevertheless, the configuration generally operates within a limited bandwidth that cannot meet the high data rate requirement of modern applications such as audio processing, video processing, and wireless communications.

Consequently, a need exists for an improved gain control circuit that can overcome the forgoing disadvantages and provide wide bandwidth, wide dynamic range, low voltage operation and high efficiency for input signal buffering.

BRIEF SUMMARY OF THE INVENTION

It is a primary object of this invention to overcome the shortcoming of known existing gain control circuits and provide wide bandwidth, wide dynamic range, low voltage operation and high efficiency for input signal buffering.

The claimed invention relates to a gain control circuit for use with input buffers having enhanced current feedback that operates at low supply voltage to provide pre-distortion gain control and wide bandwidth of operation.

According to a first aspect of the invention, there is provided a gain control circuit including a resistor having a first terminal and a second terminal; an operational amplifier having an inverting terminal thereof electrically coupled to the first terminal of the resistor; a non-inverting terminal thereof; and an output terminal thereof; wherein the difference between an input voltage received by the second end of the resistor and a reference voltage received by the non-inverting terminal is amplified and delivered at the output terminal; and an amplifier circuit for transforming the voltage change of the operational amplifier output into a substantially exponential current change; wherein the output of the amplifier circuit is electrically coupled to the inverting terminal of the operational amplifier. The current feedback path of the operational amplifier allows wideband response for high input level at low supply voltage. High linearity in db/v gain control is also achieved due to the exponential relationship in vBE versus iC in a NPN device over multiple decades of current.

Advantageously, the amplifier circuit may have a bipolar transistor in common collector configuration.

The gain control circuit may further include a first current source and a second current source connected to the output of the amplifier circuit, wherein the sum of the amplifier circuit output current and the first current source is equal to the second current source. Preferably, the ratio of current delivered by the first current source and current delivered by the second current source is substantially equal to 1:2. The current sources serve to bias the amplifier circuit properly.

The gain control circuit may further include a forward-biased bipolar diode circuit connected between the first current source and the output of the amplifier circuit. The bipolar device, in addition to the amplifier circuit, further contributes to the non-linear current-voltage behavior (exponential) of the feedback path and provides matching device to feedback path and improves matching performance.

According to another aspect of the invention, there is provided a differential circuit for gain control, including a first resistor having a first terminal and a second terminal; a first operational amplifier having an inverting terminal thereof electrically coupled to the first terminal of the first resistor; a non-inverting terminal thereof; and an output terminal thereof; wherein the difference between a positive differential input voltage received by the second end of the first resistor and a reference voltage received by the non-inverting terminal is amplified and delivered at the output terminal; a first amplifier circuit for transforming the voltage change of the output of said first operational amplifier into a substantially exponential first current change; wherein the output of said first amplifier circuit is electrically coupled to said inverting terminal of said first operational amplifier; a second resistor having a first terminal and a second terminal; a second operational amplifier having an inverting terminal electrically coupled to the second terminal of the second resistor; a non-inverting terminal; and an output terminal; wherein the difference between a negative differential input voltage received by the second end of the second resistor and a reference voltage received by the non-inverting terminal is amplified and delivered at the output terminal; and a second amplifier circuit for transforming the voltage change of the output of the second operational amplifier into a substantially exponential second current change; wherein the output of the second amplifier circuit is electrically coupled to the inverting terminal of the second operational amplifier; wherein a differential output voltage is obtained across the outputs of the respective operational amplifiers. The implementation of fully differential architecture offers better noise suppression by virtue of the differential input and common mode rejection. In addition, the differential outputs of this circuit exhibit low impedances without the need of additional buffers.

The first amplifier circuit and the second amplifier circuit may each include a bipolar transistor in common collector configuration.

The differential circuit for gain control may further include a first current source and a second current source connected to the output of the first amplifier circuit, wherein the sum of the current of the first amplifier circuit and the first current source is equal to the second current source. Advantageously, the ratio of current delivered by the first current source and the second current source is substantially equal to 1:2.

The differential circuit for gain control may further include a third current source and a fourth current source connected to the output of the second amplifier circuit, wherein the sum of the current of the second amplifier circuit and the third current source is equal to the fourth current source. Advantageously, the ratio of current delivered by the third current source and the fourth current source is substantially equal to 1:2.

The differential circuit for gain control may further include a first forward-biased bipolar diode circuit connected between the first current source and the output of the first amplifier circuit; and a second forward-biased bipolar diode circuit connected between the third current source and the output of the second amplifier circuit.

Through the foregoing arrangement, improved gain control circuits are realized that perform with wide bandwidth, wide dynamic range and excellent linearity under low voltage and low power conditions. The minimized number of components and reduced circuit complexity facilitate component matching, robust manufacturing and power reduction.

The gain control circuits according to the present invention are able to provide more than 20 db gain with good resolution. They are suitable for wide range of applications such as signal processing from audio to video frequency, in which intensity of light and sound varies in the order of more than one decade, and particularly for gain adjustment in a CCD analog front end.

Other aspects of the invention are also disclosed.

BRIEF DESCRIPTION OF THE DRAWINGS

Certain embodiments of the present invention will be described hereinafter in greater detail with reference to the drawings, in which.

DETAILED DESCRIPTION OF THE PREFERRED EMBODIMENTS

The present invention is described in detail herein in accordance with certain preferred embodiments thereof. To describe fully and clearly the details of the invention, certain descriptive names were given to the various components such as operational amplifiers, amplifiers, transistors, resistors, and diodes. It should be understood by those skilled in the art that these descriptive terms were given as a way of easily identifying the components in the description, and do not necessary limit the invention to the particular description.

Figure 5:
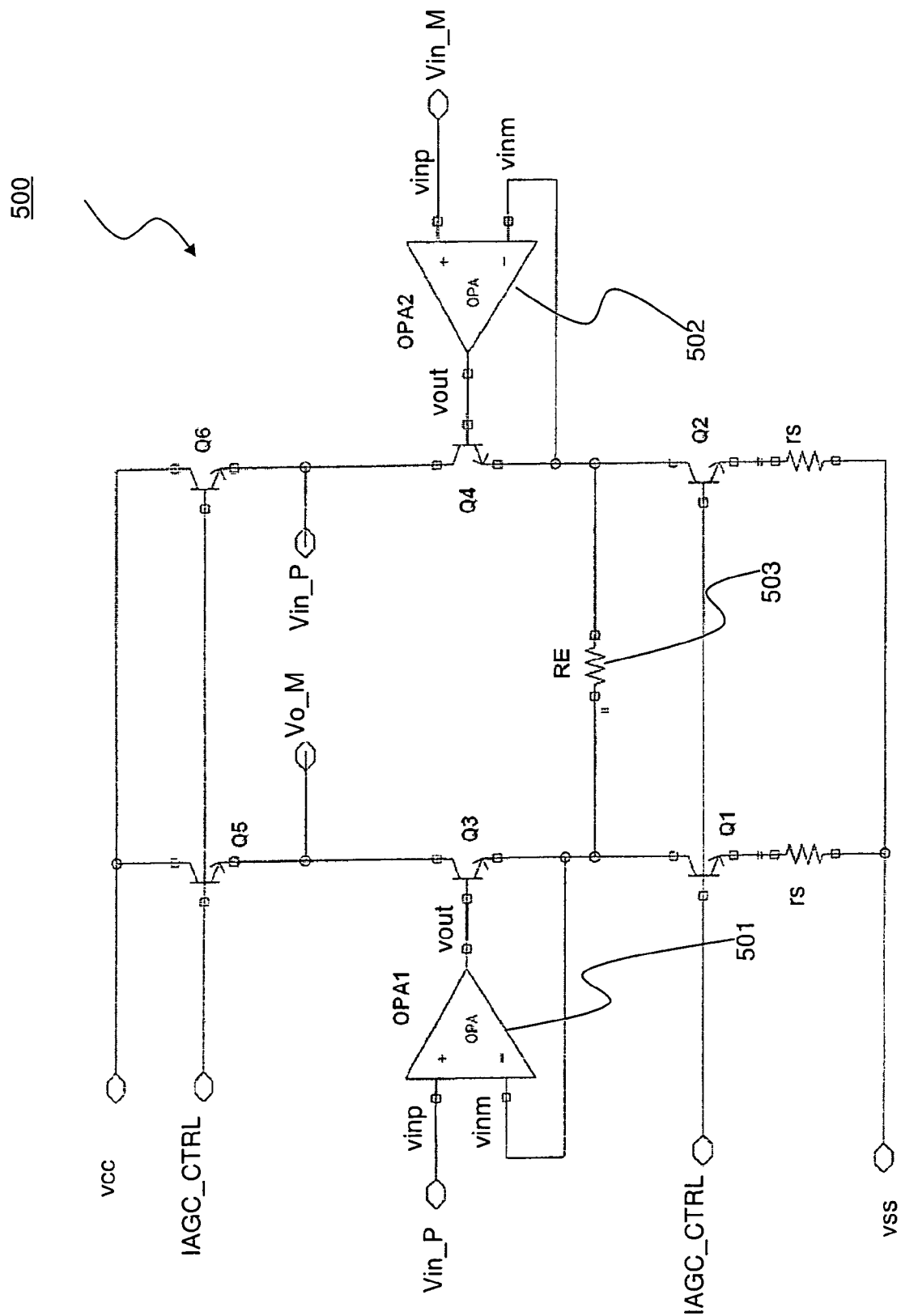
FIG. 5 is a known input buffer that provides gain control with pre-distortion.

Known input buffer 500 using voltage feedback to provide gain control with pre-distortion is shown in FIG. 5. A differential input signal voltage is buffered through OPA1 501 and OPA2 502 to form the same voltage across resistor RE 503. A signal current i_ac is created across the two terminals of RE 503. In addition, a gain control current pair of the same magnitude I_gain is created on the collectors of Q1 and Q2. As a result, signal currents of magnitude i_ac are developed on Q5 and Q6 with opposite phases.

The alternating component (ac) impedance is determined by the current I_gain such that $$re = 1/gm = vt/I\_gain$$

The differential output voltage becomes $$vout = IR = 2*vin/RE*(vt/I\_gain)$$

where vin=vin_p−vin_m
vout=vout_p−vout_m

The gain of the input buffer vout/vin is thus inversely proportional to the control current I_gain.

One of the constraints of this circuit is that Q3 and Q4 can not be turned on in order to remain operating as source follower. When the input common mode voltage is too close to the supply voltage and all voltage nodes inside the chip are equal to or below the supply voltage, also when the voltage at the emitters of Q5 an Q6 can go up to vcc−vBE and if vin=vcc−vbe, then the emitter and collector of Q3 or Q4 will have the same voltage. This will cause catastrophic operation on the circuit. Similar constraints within OPA1 501 and OPA2 502 might also happen. This implies that the input common voltage cannot be too close to the supply voltage. The input dynamic range of the input buffer is therefore imposed with a constraint.

In addition, the circuit in FIG. 5 has excess components that lead to larger die size and therefore higher manufacturing cost.

Undesirably, extra matching requirements have to be fulfilled at the outputs of the circuit. Accordingly, more matching components have to be added that lead to even higher manufacturing cost as well as lower production yield.

Furthermore, higher supply voltage and/or more buffers are required which disadvantageously leads to higher power consumption and dissipation due to the constraint in dynamic range of input signal. It is therefore not suitable for low-voltage application. The efficiency of the circuit is also low due to the extra power consumption.

Figure 6:
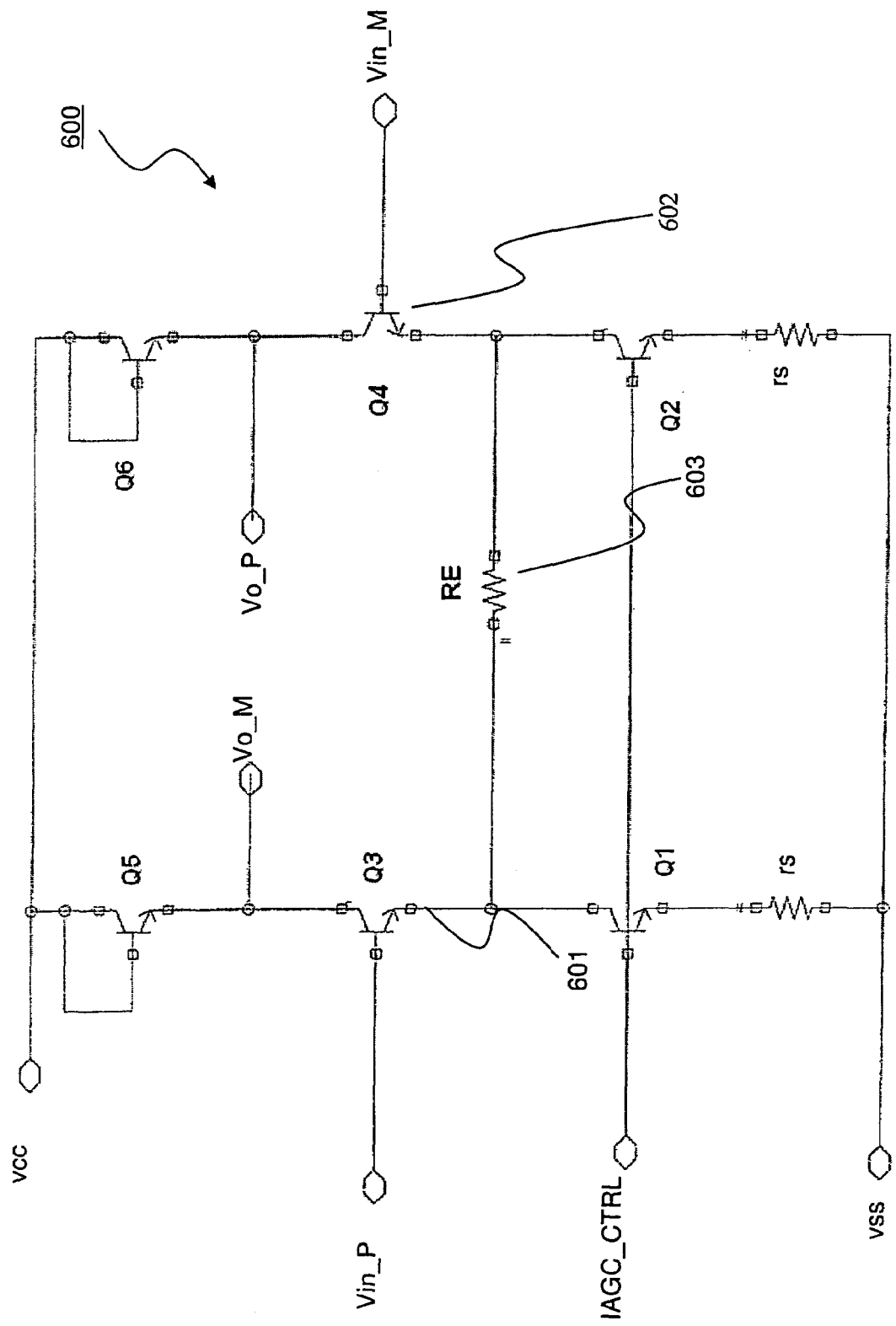
FIG. 6 is another known input buffer that provides gain control with pre-distortion.

Another known input buffer 600 that provides gain control with pre-distortion is shown in FIG. 6. The operation of the circuit in FIG. 6 is similar to that in FIG. 5. The main difference between is that differential input signal voltage is not buffered by an operational amplifier in FIG. 6. The application of a differential signal voltage input across the base of transistors Q3 601, Q4 602 creates a signal current i_ac through the two terminals of RE 603 which further flows into and out of the source impedances of the input transistors Q3 601, Q4 602 at the emitter. The collector currents of transistors Q1 and Q2 act as a gain control current pair. The resulting output current at the emitter of transistors Q5 and Q6 is inversely proportional to the signal input. The circuit is operating in common emitter mode with undesired source degeneration.

The gain vout/vin in the circuit of FIG. 6 is:

$$2/(2 + gm*RE) = 2/gm*(1/(2/gm + RE))$$

$$= (Vt/I\_gain)*(2/(2/gm + RE))$$

where vin=vin_p−vin_m
out=vout_p−vout_m

The gain vout/vin is thus inversely proportional to the control current I_gain, while the term of 1/gm causes non-linear operation on the output signal.

The constraints of this circuit is same as the one in FIG. 5, the transistors Q3 601 and Q4 602 cannot be turned on so that they remain as source follower. Furthermore, the voltage at emitter of transistors Q5 and Q6 is bound to the value of vcc−vbe. When the input common mode voltage is too close to the supply voltage and all voltage nodes inside the chip are equal to or below the supply voltage, undesired catastrophic operation on the circuit will be caused. This imposes a constraint on the dynamic range of the input common voltage such that it cannot be too close to the supply voltage.

Other disadvantages of the circuit in FIG. 6 include significant distortion at low control current due to the degradation on current gain beta of BJT devices at low currents. In addition, higher supply voltage and/or more buffers are required due to the constraint in dynamic range of input signal which leads to higher power consumption and dissipation. The efficiency of the circuit is therefore low because of this extra power consumption. The circuit also cannot be used in low-voltage electronic devices.

Figure 1:
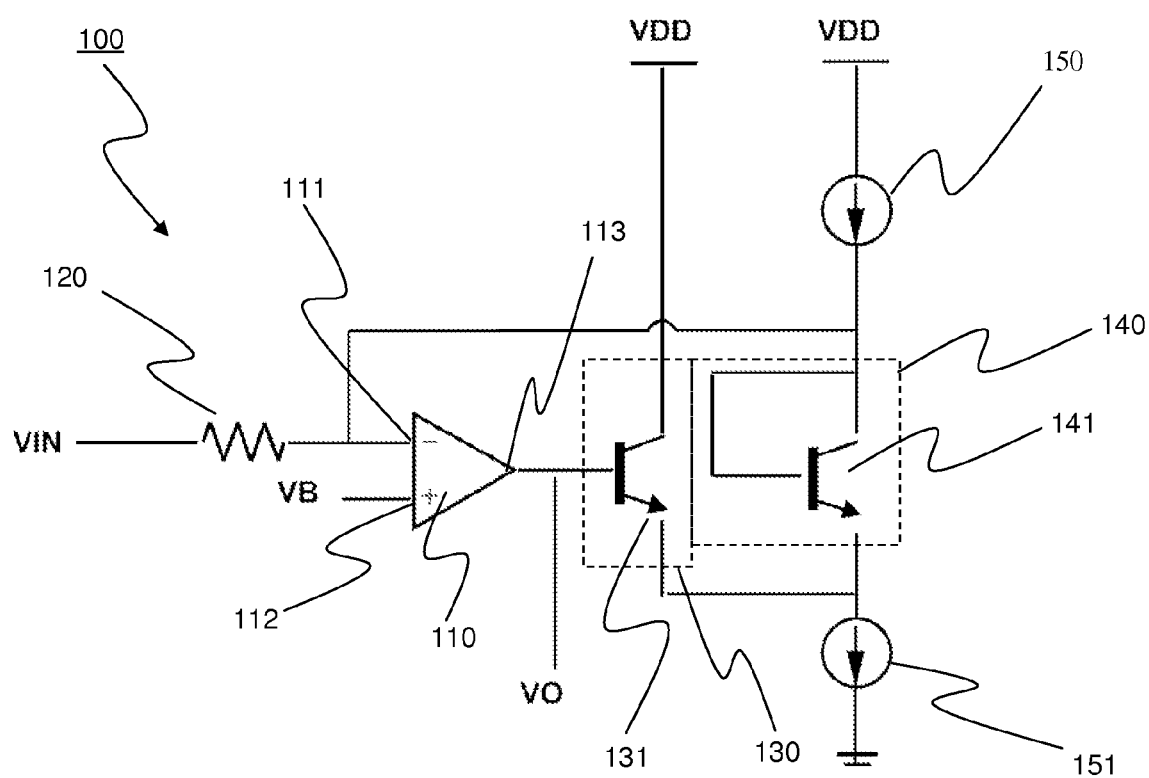
FIG. 1 is a circuit diagram for a gain control circuit according to an embodiment of the present invention.

FIG. 1 shows a circuit diagram for a gain control circuit according to an embodiment of the present invention. The input signal voltage VIN, possibly acquired from a sensor or transducer, is applied through a resistor 120 of value rs to the inverting terminal 111 of an operational amplifier 110. The non-inverting terminal 112 of the operational amplifier 110 receives a reference voltage VB. The voltage difference of the inverting terminal 111 and the non-inverting terminal 112 is amplified and output at the output terminal 113 as output voltage VO. The output terminal 113 of the operational amplifier 110 is electrically coupled to the input of an amplifier circuit 130. In an exemplary embodiment of the present invention, the amplifier circuit 130 is a bipolar NPN transistor 131 configured as an emitter follower. The output voltage VO is applied to the base terminal of the transistor 131. The collector terminal of the transistor 131 is electrically coupled to the supply voltage VDD. The emitter terminal of the transistor 131 is further connected to a load, preferably a diode circuit 140 implemented by a self-biased bipolar NPN transistor 141. Both the emitter terminals of the transistors 131 and 141 are connected together, whereas the base and collector terminals of the transistor 141 are electrically coupled to the inverting terminal 111 of the operational amplifier 110. A first current source 150 and a second current source 151 are arranged to bias the bipolar transistors 131, 141 such that the positive and negative terminals of the first current source 150 are connected respectively to the collector terminal of the transistor 141 and the supply voltage VDD. In addition, the positive and negative terminals of the second current source 151 are connected respectively to the emitter terminal of the transistor 141 and the ground. As such, the amplifier circuit 130 and the diode circuit 140 form a feedback path for the operational amplifier 110.

Under operation, the input signal VIN is changed from voltage into current $\Delta i\_rs$ by using operational amplifier 110, where $$\Delta i\_rs = (VIN - VB)/rs$$

When there is no signal input, VIN is equal to VB. Since both inverting and non-inverting terminals 111, 112 of the operational amplifier 110 are held to have small difference by the feedback path, there is no potential difference across the resistor 120 and no current is produced. Assuming current source 150 delivers a current of $\alpha 1 * I\_AGC$ and current source 151 delivers a current of $\alpha 2 * I\_AGC$, the collector current of the transistor 131 becomes:

$$\alpha 2 * I\_AGC - \alpha 1 * I\_AGC$$

Further assuming $\alpha 1 : \alpha 2 = 1:2$, the collector current of transistor 131 becomes:

$$\alpha 1 * I\_AGC$$

In addition, the sum of the collector current through transistors 131 and 141 should be equal to the current source 151 at the bottom:

$$\alpha 2 * I\_AGC$$

Hence the collector current of transistor 131 is:

$$\alpha 2 * I\_AGC - \alpha 1 * I\_AGC = \alpha 1 * I\_AGC$$

When there is signal input to the gain control circuit 100, two scenarios arise according to the signal level. When input voltage VIN is higher than reference voltage VB, an additional input current $\Delta i\_rs$ flows into the transistor 141 and the total collector current of transistor 141 becomes:

$$\alpha 1 * I\_AGC + \Delta i\_rs$$

Because the sum of collector current of transistors 131 and 141 must be equal to the second current source 151, i.e.: $\alpha 2 * I\_AGC$, the collector current of transistor 131 equals to:

$$(\alpha 2 * I\_AGC - \alpha 1 * I\_AGC) - \Delta i\_rs$$

The base voltage of transistor 131 which is also the output of the gain control circuit 100 then becomes $VO - \Delta v$, $$VO - \Delta v = VB - Vt * ln((\alpha 2 * I\_AGC - \alpha 1 * I\_AGC) - \Delta i\_rs)/Is))$$

When input voltage VIN is lower than reference voltage VB, the input current $\Delta i\_rs$ is a component drawing from the first current source 150, i.e.: $\alpha 1 * I\_AGC$. The collector current of transistor 141 becomes:

$$\alpha 1 * I\_AGC - \Delta i\_rs$$

and the collector current of transistor 131 becomes:

$$(\alpha 2 * I\_AGC - \alpha 1 * I\_AGC) + \Delta i\_rs$$

The base voltage of transistor 131 which is also the output of the gain control circuit 100 becomes $VO + \Delta v$, $$VO + \Delta v = VB - Vt * ln((\alpha 2 * I\_AGC - \alpha 1 * I\_AGC) + \Delta i\_rs)/Is))$$

Taking advantage of the logarithmic relationship between the small signal base voltage, $\Delta vb$ and the respective collector current of transistors 131, 141:

$$i_c \propto e^{vBE/VT}$$

The gain control circuit 100 is able to provide a higher gain for small input signal and a smaller gain for large input signal. The gain vout/vin for the circuit is:

$$\frac{v_o}{v_{in}} = \frac{i*R}{v_{in}} = \frac{1}{rs} * \frac{1}{gm} = \frac{1}{rs} * \frac{V_T}{\alpha 1 * IAGC}$$

where gm is the transconductance of transistor 141

Whereas the last term $$\frac{V_T}{\alpha 1 * IAGC}$$

is the control function derived for small signal analysis, it provides multiple decade of resolution for bipolar devices, such as diodes and transistors. According to the control function $$\frac{V_T}{\alpha 1 * IAGC},$$

gain control can be actuated by varying IAGC.

In addition, since the voltage-to-current conversion is implemented at the input of the gain control circuit 100, the constraints on the input headroom can be released such that the signal range is not limited by the supply voltage VDD and wide dynamic input can be accomplished. The gain control circuit 100 is thus especially suitable for low voltage applications.

Furthermore, the enhanced current feedback creates one dominant high frequency pole far away from the second pole. Without the current feedback part, it needs another gain stage, for example, a common emitter amplifier to construct the negative feedback path. As a result, the circuit has 2 gain stages and thereby introducing two dominant poles. Such dominant poles disadvantageously lead to narrow bandwidth. The embodiment in FIG. 1 removes such problems of generic current feedback associating with two close dominant poles. Signal processing of wide closed loop bandwidth with stability is achieved by the gain control circuit intuitively.

According to an embodiment of the present invention, bipolar NPN devices are preferably to be used as the amplifier circuit 130 and the diode circuit 140 in the feedback signal path. This is because NPN devices offer exponential relationship on base-emitter voltage, vBE versus collector current, iC over a range of more than four decades in ic:

$$i_c \propto e^{vBE/Vt}$$

In an exemplary bipolar process, a change of 60 mv in vBE results in change of one decade in current variation of ic. NPN devices also offer well matched device behavior under proper layout design, as the output impedance, re of a emitter follower (or common-collector) or a NPN diode is inversely proportional to the collector current, iC through this device:

$$re=1/gm, gm=Ic/Vt$$

hence, $$re=Vt/Ic$$

It is an object of the present invention to avoid or mitigate the disadvantages set out above.

In the circuit of FIG. 1, the variable impedance re (from a pair of NPN devices 131, 141) depends on the control current ic_ctrl (=IAGC) where the signal current is ic_sig (=vin/rs). Linear control impedance is achieved as along as ic_ctrl>ic_sig. In an exemplary bipolar process, vBE only change 240 mV for four decades of variation of ic. This reduces the common mode voltage range of devices in bipolar amplifier design. The reduced common mode voltage range offers advantages for processing a wide range of variation of signal, for example, due to the variation of light intensity in the output of a CCD (Charge-Coupled Device) sensor.

The embodiment with respect to single end version of the gain control circuit in FIG. 1 is good for image signal processing after CDS, since the reference signal is steady. Moreover, the benefits of differential circuit can still be obtained by combing the output signal and the reference signal as a differential signal with low source impedance.

Figure 3:
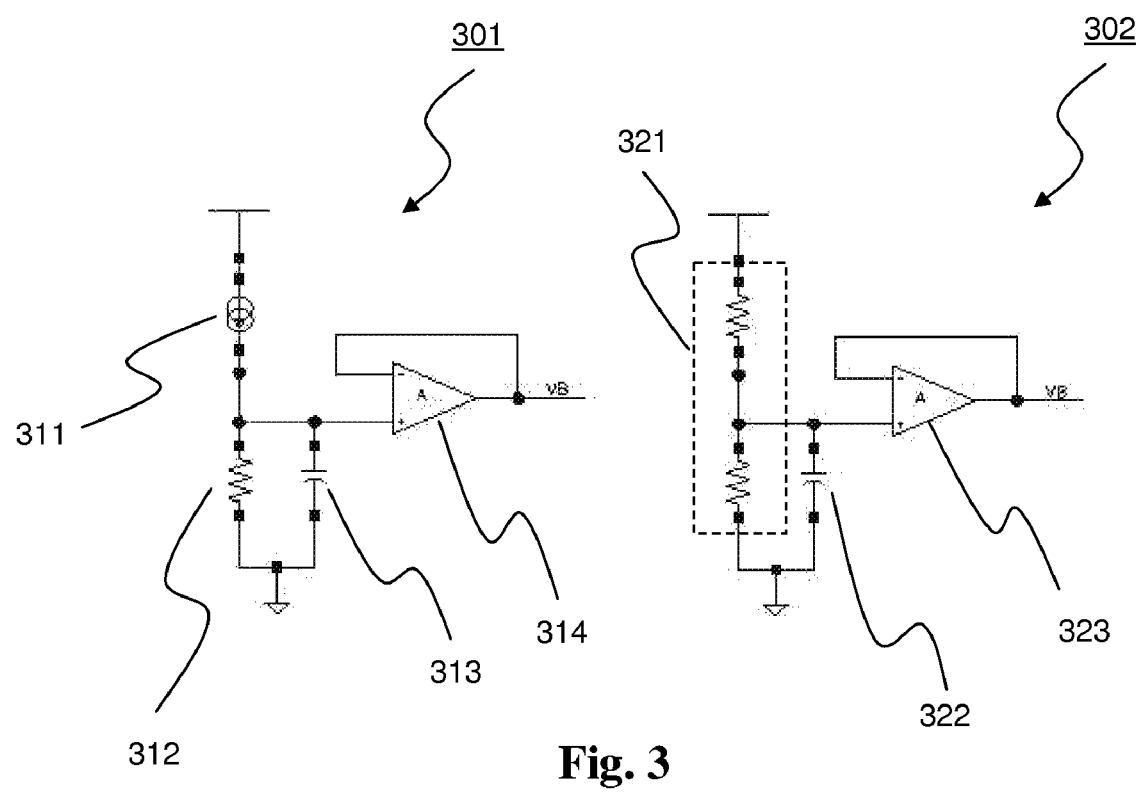
FIG. 3 is a circuit diagram for two known reference voltage generation circuits that can be used in embodiments in FIGS. 1 and 2.

It will be understood that the reference voltage VB can be generated by known voltage reference generation circuits which have a low noise and low source impedance output with minimum output voltage fluctuation. Examples of such circuits 301, 302 are shown in FIG. 3. Circuit 301 comprises a resistor 312 which converts a constant current from current source 311 to voltage. The voltage signal subsequently propagates through a low pass noise filter 313 comprising a capacitor and is buffered by a source follower or unity gain buffer 314 to provide a voltage reference VB. Circuit 302 comprises a resistor network 321 which divides a substantially constant voltage signal from the supply voltage. Such voltage signal then propagates through a low pass noise filter 322 comprising a capacitor and is buffered by a source follower or unity gain buffer 323 to provide a voltage reference VB.

Figure 4:
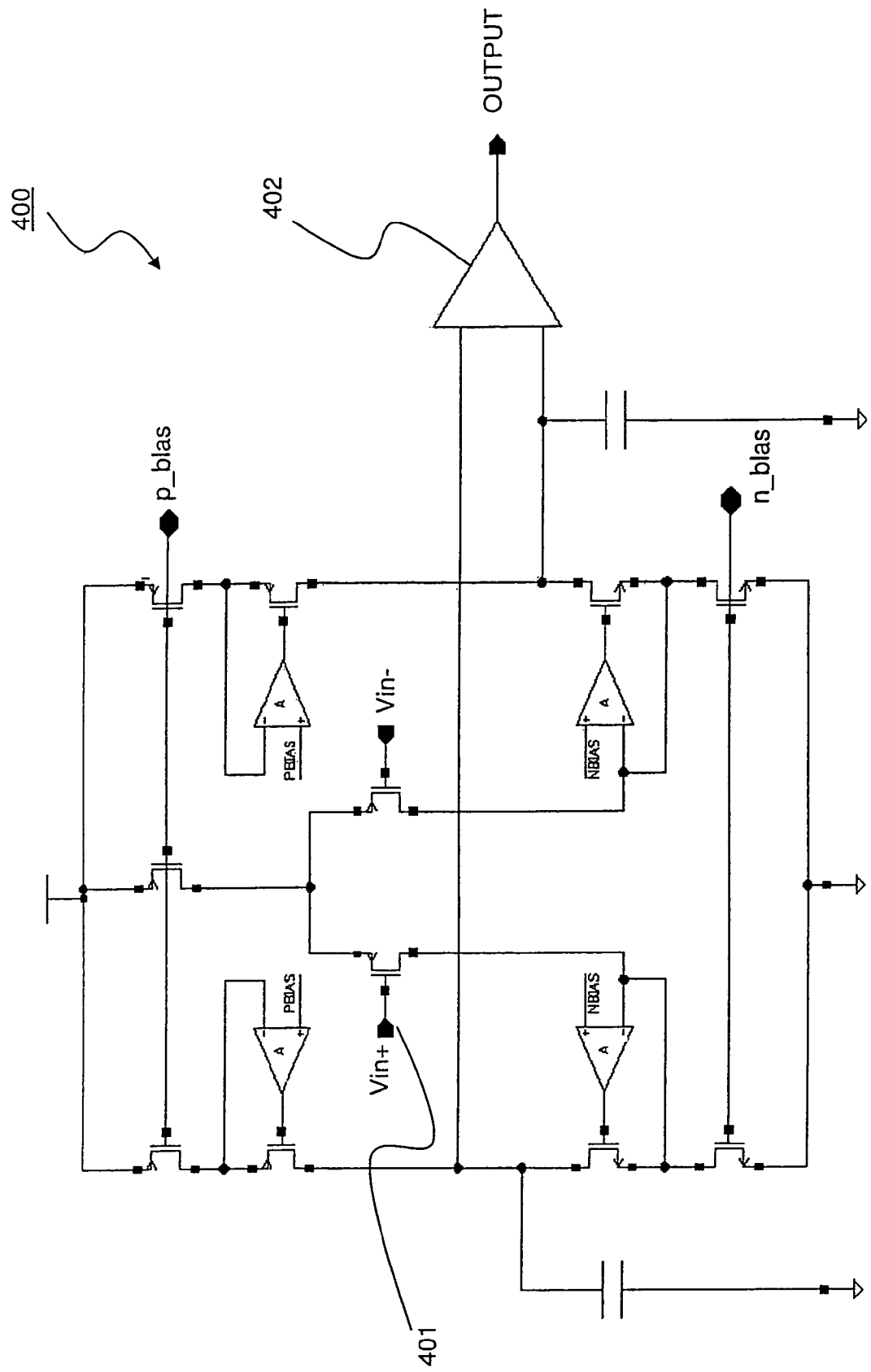
FIG. 4 is a circuit diagram for an operational amplifier that can be used in embodiments in FIGS. 1 and 2.

It will also be understood that the operational amplifier in the foregoing description can be any known operational amplifiers that offer a high gain bandwidth product. An example of such operational amplifiers is shown in FIG. 4. The circuit 400 follows configuration of a typical operational amplifier and comprises a differential input stage 401 receiving the positive and negative inputs Vin+, Vin−. The inputs are then buffered and amplified by an output stage 402 to provide a desired gain.

According to another embodiment of the present invention, the NPN transistors 131, 141 and current sources can be fabricated by bipolar process while the operational amplifier 110 and other circuit components can be fabricated by CMOS process on the same integrated circuit by utilizing the BiCMOS technology.

Figure 2:
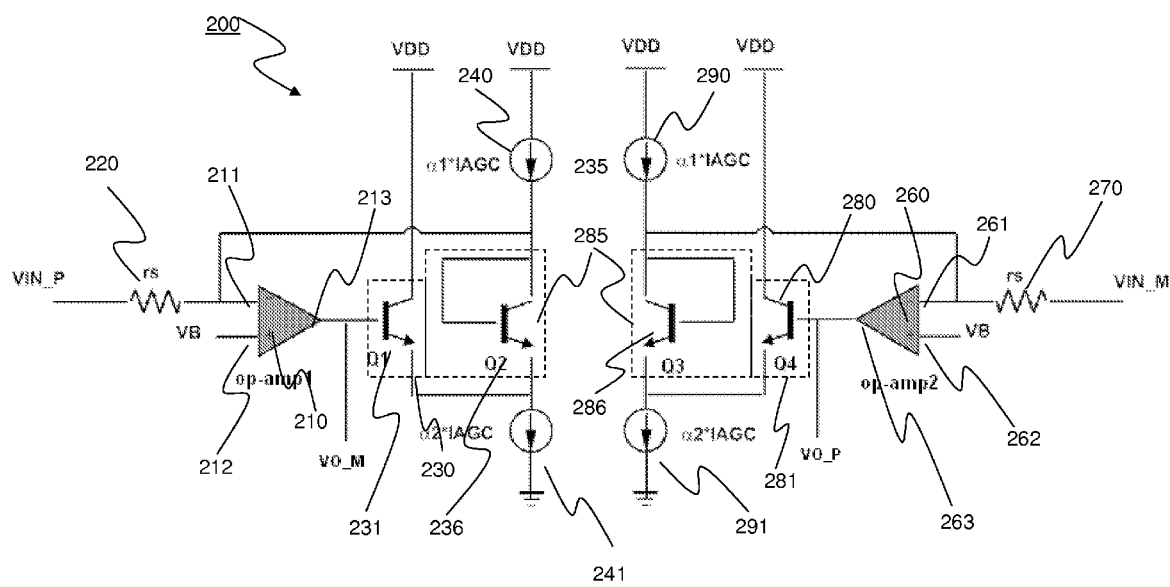
FIG. 2 is a circuit diagram for a gain control circuit according to another embodiment of the present invention.

FIG. 2 shows a differential circuit for gain control according to an embodiment of the present invention. The circuit in FIG. 1 now becomes the half circuit of the differential circuit in FIG. 2. Through the implementation of fully differential architecture based on the gain control circuit in FIG. 1, better noise suppression can be achieved by virtue of the differential input. In addition, the differential outputs of this circuit are from low impedances without the need of additional buffers. Furthermore, an operational amplifier that receives input signal at the inverting input terminal then outputs signal that is 180 degree out of phase with the input signal. Therefore, the polarity of the differential outputs VO_M, VO_P delivered respectively by the operational amplifiers 210, 260 have inverted polarity of the corresponding differential inputs VIN_P, VIN_M.

In the left half circuit of FIG. 2, the positive differential input signal voltage VIN_P is applied through a resistor 220 to the inverting terminal 211 of an operational amplifier 210. The non-inverting terminal 212 of the operational amplifier 210 receives a reference voltage VB. The voltage difference of the inverting terminal 211 and the non-inverting terminal 212 is amplified and output at the output terminal 213 as the negative differential output voltage VO_M. The output terminal 213 of the operational amplifier 210 is electrically coupled to the input of an amplifier circuit 230. In an exemplary embodiment of the present invention, the amplifier circuit 230 is a bipolar NPN transistor 231 configured as an emitter follower. The negative differential output voltage VO_M is applied to the base terminal of the transistor 231. The collector terminal of the transistor 231 is electrically coupled to the supply voltage VDD. The emitter terminal of the transistor 231 is further connected to a load, preferably a diode circuit 235 implemented by a self-biased bipolar NPN transistor 236. Both the emitter terminals of the transistors 231 and 236 are connected together, whereas the base and collector terminals of the transistor 236 are electrically coupled to the inverting terminal 211 of the operational amplifier 210. A first current source 240 and a second current source 241 are arranged to bias the bipolar transistors 231, 236 such that the positive and negative terminals of the first current source 240 are connected respectively to the collector terminal of the transistor 236 and the supply voltage VDD. In addition, the positive and negative terminals of the second current source 241 are connected respectively to the emitter terminal of the transistor 236 and the ground. As such, the amplifier circuit 230 and the diode circuit 235 form a feedback path for the operational amplifier 210.

The right half circuit of FIG. 2 is a mirror of the left half circuit, the negative differential input signal voltage VIN_M is applied through a resistor 270 to the inverting terminal 261 of an operational amplifier 260. The non-inverting terminal 262 of the operational amplifier 260 receives a reference voltage VB. The voltage difference of the inverting terminal 261 and the non-inverting terminal 262 is amplified and output at the output terminal 263 as the negative differential output voltage VO_P. The output terminal 263 of the operational amplifier 260 is electrically coupled to the input of an amplifier circuit 280. In an exemplary embodiment of the present invention, the amplifier circuit 280 is a bipolar NPN transistor 281 configured as an emitter follower. The positive differential output voltage VO_P is applied to the base terminal of the transistor 281. The collector terminal of the transistor 281 is electrically coupled to the supply voltage VDD. The emitter terminal of the transistor 281 is further connected to a load, preferably a diode circuit 285 implemented by a self-biased bipolar NPN transistor 286. Both the emitter terminals of the transistors 281 and 286 are connected together, whereas the base and collector terminals of the transistor 286 are electrically coupled to the inverting terminal 261 of the operational amplifier 260. A third current source 290 and a fourth current source 291 are arranged to bias the bipolar transistors 281, 286 such that the positive and negative terminals of the first current source 290 are connected respectively to the collector terminal of the transistor 286 and the supply voltage VDD. In addition, the positive and negative terminals of the second current source 291 are connected respectively to the emitter terminal of the transistor 286 and the ground. As such, the amplifier circuit 280 and the diode circuit 285 form a feedback path for the operational amplifier 260.

The above described gain control circuits are able to perform wide bandwidth input signal buffering with linearity under low voltage and low power conditions. The circuits also offer low output impedances without the need of additional buffers and hence minimizing circuit size and manufacturing costs. The low output impedance also provides an advantage to allow less matching components which further leads to manufacturing efficiency. This invention is especially useful in portable devices when low operating voltage is required, whereas gain control circuit of more than 20 db bandwidth with good resolution is desirable.

INDUSTRIAL APPLICABILITY

The arrangements described are applicable to the integrated circuit industries and particularly for circuits that are required to capture with a weak signal source, including analog front end for image signal processing, audio signal processing, radio frequency signal processing in wireless communication, and optoelectronics. The arrangements are especially suitable for low voltage applications such as portable devices.

The foregoing describes only some embodiment of the present invention, and modifications and/or changes can be made thereto without departing from the scope and spirit of the invention, the embodiments being illustrative and not restrictive.

We claim:

1. A gain control circuit, comprising:
a resistor having a first terminal and a second terminal;
an operational amplifier having an inverting terminal thereof electrically coupled to said first terminal of said resistor; a non-inverting terminal thereof; and an output terminal thereof; wherein the difference between an input voltage received by said second end of said resistor and a reference voltage received by said non-inverting terminal is amplified and delivered at said output terminal; and
an amplifier circuit for transforming the voltage change of said operational amplifier output into a substantially exponential current change; wherein the output of said amplifier circuit is electrically coupled to said inverting terminal of said operational amplifier;
a first current source and a second current source connected to the output of said amplifier circuit, wherein the sum of the amplifier circuit output current and said first current source is equal to said second current source; and
a forward-biased bipolar diode circuit connected between said first current source and the output of said amplifier circuit.

2. A differential circuit for gain control, comprising:
a first resistor having a first terminal and a second terminal;
a first operational amplifier having an inverting terminal thereof electrically coupled to said first terminal of said first resistor; a non-inverting terminal thereof; and an output terminal thereof; wherein the difference between a positive differential input voltage received by said second end of said first resistor and a reference voltage received by said non-inverting terminal is amplified and delivered at said output terminal;
a first amplifier circuit for transforming the voltage change of the output of said first operational amplifier into a substantially exponential first current change; wherein the output of said first amplifier circuit is electrically coupled to said inverting terminal of said first operational amplifier;
a second resistor having a first terminal and a second terminal;
a second operational amplifier having an inverting terminal electrically coupled to said second terminal of said second resistor; a non-inverting terminal; and an output terminal; wherein the difference between a negative differential input voltage received by said second end of said second resistor and a reference voltage received by said non-inverting terminal is amplified and delivered at said output terminal; and
a second amplifier circuit for transforming the voltage change of the output of said second operational amplifier into a substantially exponential second current change; wherein the output of said second amplifier circuit is electrically coupled to said inverting terminal of said second operational amplifier;
wherein a differential output voltage is obtained across the outputs of said respective operational amplifiers.

3. The differential circuit for gain control of claim 2, wherein said first amplifier circuit and said second amplifier circuit each comprises a bipolar transistor in common collector configuration.

4. The differential circuit for gain control of claim 2, further comprising a first current source and a second current source connected to the output of said first amplifier circuit, wherein the sum of the current of said first amplifier circuit and said first current source is equal to said second current source.

5. The differential circuit for gain control of claim 2, further comprising a third current source and a fourth current source connected to the output of said second amplifier circuit, wherein the sum of the current of said second amplifier circuit and said third current source is equal to said fourth current source.

6. The differential circuit for gain control of claim 4, wherein the ratio of current delivered by said first current source and said second current source is substantially equal to 1:2.

7. The differential circuit for gain control of claim 5, wherein the ratio of current delivered by said third current source and said fourth current source is substantially equal to 1:2.

8. The differential circuit for gain control of claim 4, further comprising a first forward-biased bipolar diode circuit connected between said first current source and the output of said first amplifier circuit.

9. The differential circuit for gain control of claim 4, further comprising a second forward-biased bipolar diode circuit connected between said third current source and the output of said second amplifier circuit.

* * * * *